United States Patent [19]

Kwok

[11] Patent Number: 4,745,082
[45] Date of Patent: May 17, 1988

[54] METHOD OF MAKING A SELF-ALIGNED MESFET USING A SUBSTITUTIONAL GATE WITH SIDE WALLS

[75] Inventor: Siang P. Kwok, Colorado Springs, Colo.

[73] Assignee: Ford Microelectronics, Inc., Colorado Springs, Colo.

[21] Appl. No.: 873,515

[22] Filed: Jun. 12, 1986

[51] Int. Cl.⁴ ............... H01L 21/306; H01L 21/265; H01L 21/24

[52] U.S. Cl. .................................. 437/39; 437/44; 437/149; 437/154; 437/176; 437/245; 437/912; 437/944; 437/231; 357/22; 148/DIG. 53; 148/DIG. 139; 148/DIG. 140

[58] Field of Search ............... 29/571, 576 B, 578, 29/579, 591; 148/1.5, 187, DIG. 53, DIG. 139, DIG. 140; 357/41, 65, 91, 59; 156/643, 653, 656

[56] References Cited

U.S. PATENT DOCUMENTS

| | | | |
|---|---|---|---|
| 4,334,349 | 6/1982 | Aoyama et al. | 29/579 |
| 4,351,099 | 9/1982 | Takagi et al. | 29/571 |
| 4,503,599 | 3/1985 | Ueyanagi et al. | 29/571 |
| 4,505,023 | 3/1985 | Tseng et al. | 29/571 |
| 4,532,004 | 7/1985 | Akiyama et al. | 156/653 |
| 4,546,540 | 10/1985 | Ueyanagi et al. | 29/579 |
| 4,561,169 | 12/1985 | Miyazaki et al. | 29/571 |
| 4,569,119 | 2/1986 | Terada et al. | 29/571 |

OTHER PUBLICATIONS

Yamasaki et al., "GaAs LSI-Directed MESFET's with Self-Aligned...", IEEE Trans. on Elect. Devices, vol. 29, No. 11, Nov. 1982, pp. 1772-1777.

Primary Examiner—Brian E. Hearn
Assistant Examiner—William Bunch
Attorney, Agent, or Firm—Brooks & Kushman

[57] ABSTRACT

A process for producing a semiconductor device includes depositing a layer of insulator material onto a supporting substrate of the type having a surface which includes a channel region below the surface thereof containing a carrier concentration of a desired conductivity type, removing selected portions of the insulator material to form a substitutional gate on the substrate surface, forming side walls bounding substitutional gate to define an effective masking area in cooperation with the substitutional gate, ion implanting a dopant into the unmasked region of the substrate, removing the side walls, annealing the resultant device, removing the substitutional gate, depositing gate metal and first and second ohmic contacts in correct positional relation to one another on the substrate, and depositing metallic interconnects in electrical communication with the ohmic contacts to produce a semiconductor device. This technique is especially useful in the production of Group III-V compound semiconductors, particularly gallium arsenide semiconductors.

22 Claims, 2 Drawing Sheets b) SUBSTITUTIONAL GATE FORMATION

FIG 2
a) Ion IMPLANTATION & ANNEALING
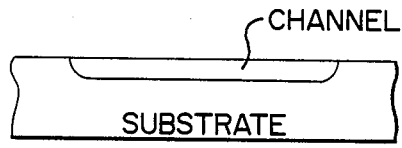
b) SUBSTITUTIONAL GATE FORMATION
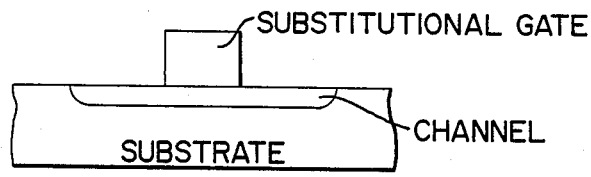
c) SIDEWALL FORMATION & Ion IMPLANTATION
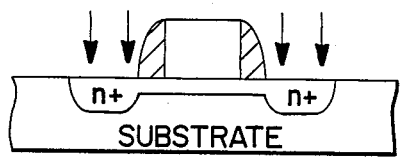
d) SIDEWALL REMOVAL, PLANARIZATION & ETCH BACK
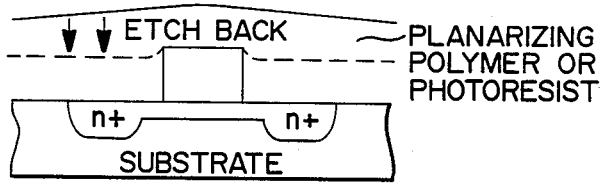
e) SUBSTITUTIONAL GATE REMOVAL
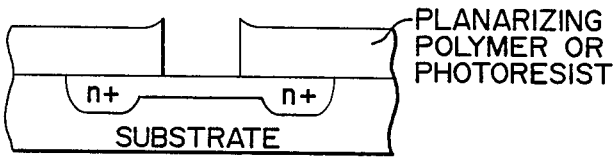
f) GATE DEPOSITION
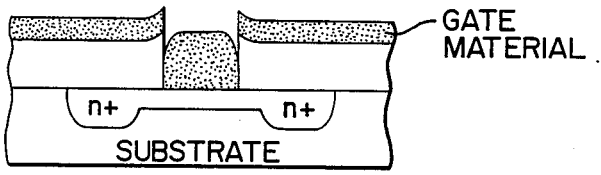
g) PHOTORESIST LIFT-OFF, OHMIC CONTACT & INTERCONNECT METAL FORMATION
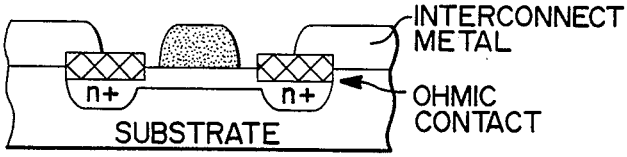

METHOD OF MAKING A SELF-ALIGNED MESFET USING A SUBSTITUTIONAL GATE WITH SIDE WALLS

TECHNICAL FIELD

The present invention relates to a method for self-aligning the gate in a MESFET.

BACKGROUND ART

Self-alignment techniques are used routinely in traditional MOSFET technology. The conventional technology has been called silicon gate technology. The use of III-V compounds presents different problems than those encountered in silicon technology. For example, the annealing step in the fabrication of III-V compound semiconductors generally requires a cap to prevent elemental evaporation. In the fabrication of gallium arsenide devices, caps are generally used to prevent arsine evaporation, thereby maintaining the stoichiometry of the material.

In the practice of self-alignment technology, the transistor is first fabricated up to the gate level. Ion implantation is then utilized to form highly conductive areas for the source and drain. In this ion implantation step, the gate acts as a mask to protect certain areas from ion implantation. Consequently, the highly conductive source and drain areas extend to a region directly underneath the gate area, thereby reducing source and gate resistance. Thereafter, an annealing cap is deposited and the sample is annealed for activation of the implanted species. The annealing cap is removed and further fabrication steps are implemented to produce a semiconductor device.

Controlling the gate length is extremely important in the fabrication of semiconductor devices. Circuit performance is dependent upon gate length because the transistor's performance is strongly influenced by gate length. It is highly desirable to have a slightly longer channel length underneath the gate of a semiconductor because a longer channel will reduce the breakdown voltage at the gate. It is also desirable to reduce the leakage current between the gate and the channel and to reduce the feedback (Miller effect) capacitance between the drain and the gate and the gate and the source.

Previously, a dummy gate was deposited onto a silicon dioxide layer on top of the channel region of a substrate. An aluminum layer was deposited onto the silicon dioxide before etching techniques were utilized to remove portions of the silicon dioxide layer. The resultant dummy gate was a structure of a silicon dioxide layer having an aluminum cap deposited thereon. The wafer was then ion implanted, utilizing the aluminum cap as a mask to protect the channel from ion implantation. The dummy gate was thereafter etched to form an undercut beneath the aluminum mask. This process allows the final gate metal length to be smaller than the channel length because the gate metal is deposited into the space left behind after the dummy gate has been removed.

The aluminum cap is then stripped off and an annealing cap is applied before high temperature annealing is performed, whereby arsenic evaporation is prevented in gallium arsenide devices. This method cannot reliably control the uniformity of the gate length because the undercutting operation cannot be controlled sufficiently. Additionally, the granular size of the aluminum is too large to be suitable for sub-micron geometries because a ragged gate structure is produced. Moreover, the lifting off of the aluminum gate mask after the silicon dioxide annealing cap has been deposited is difficult to achieve by using chemical etching. Because gate length strongly influence a FET's performance, circuit performance is difficult to control if gate length cannot be consistently uniform.

U.S. Pat. No. 4,532,695 issued to Schuermeyer on Aug. 6, 1985, entitled "Method of Making Self-Aligned discloses an IGFET". The IGFET is formed on a gallium arsenide wafer which is coated with a layer of silicon nitride and a silicon dioxide layer. The silicon dioxide is etched away in transistor areas and ion implanting provides channel doping. A gate of refractory metal such as molybdenum is deposited and delineated. The gate and silicon dioxide act as masks for ion implantation of the source and drain. No dummy or substitutional gates are used to control the gate length.

U.S. Pat. No. 4,472,872 issued to Toyoda, et al. on Sept. 25, 1984, entitled "Method of Fabricating a Schottky Gate Field Effect Transistor" discloses a Schottky gate FET is fabricated by forming on a semiconductor substrate first and second stacks facing each other. Each stack is constructed by an ohmic electrode and a spacer film. On the substrate having stacks formed thereon an insulation layer is formed and is anisotropically etched in the direction of its thickness until the planar surface portions are exposed. As a result, portions of the insulation layer remain on opposing sidewalls of the stacks. After removing the spacer films to define stepped portions between each remaining portion and each electrode, a layer of a metallic material capable of forming a Schottky barrier with the substrate is formed. The remaining portions are removed to pattern the metallic material layer, thereby forming a Schottky gate electrode.

DISCLOSURE OF THE INVENTION

The present invention provides an improved process for producing a semiconductor device. More specifically, the present invention provides a process utilizing a substitutional gate having sidewall constructions to mask channel regions during ion implantation steps.

The process comprises depositing a layer of insulator material onto a supporting substrate on its surface. The substrate includes a channel region below the surface containing a carrier concentration of a desired conductivity type. Removing selected portions of the insulator material forms a substitutional gate on the substrate surface. Sidewalls are formed which bind the substitutional gate to define an effective masking area in cooperation with the substitutional gate. Ion implanting over the masked area places a dopant into the unmasked region of the substrate to provide n+ channel doping in desired areas. The sidewalls are removed and the resultant device is annealed to activate the dopant in the substrate. Removing the substitutional gate and depositing gate metal into the space remaining after the gate has been removed controls the gate length because the length will be the same as the substitutional gate, while the channel length will be the same as the substitutional gate plus the sidewalls. It is very desirable to have a channel length longer than the gate length.

First and second ohmic contacts are deposited in correct positional relation to one another on the substrate, and metallic interconnects are deposited in electrical communication with the ohmic contacts to produce a semiconductor device.

The supporting substrate preferably includes semi-insulating gallium arsenide but may be other Group III-V compounds or silicon. The insulator material may be silicon dioxide, while the sidewalls may be made of silicon nitride, polymers or photoresist. N or n+-type implantation species are ion implanted while the gate and sidewalls act as a mask to prevent ion implantation directly under the area they are masking. Removal of the sidewalls is accomplished by dry etching or reactive ion etching. To compliment this process, capless annealing may be performed at high temperatures, using arsine gas environments in an overpressure.

Planarizing material, such as polymers or photoresist is applied as a conformal layer over the substrate surface and the substitutional gate, and is etched back to expose the substitutional gate which is thereafter removed by the application of buffered hydrofluoric acid. The planarizing material forms a desired angle between the top of the planarizing material structure, the bottom of the structure and the surface of the substrate by virtue of the substitutional gate profile. This undercutting defines a certain shape of gate metal when it is deposited into the area left empty by the removal of the substitutional gate. The remaining process steps are standard in the art for the production of a semiconductor device.

Other advantages and features of the present invention will be appreciated from the following description.

BRIEF DESCRIPTION OF THE DRAWINGS

The invention is described in greater detail hereinafter and the features which are believed to be novel are set forth with particularity in the claims. The invention may best be understood by making reference to the following attached drawings wherein:

FIG. 2 illustrates representative steps in the fabrication of the MESFET of the present invention.

DETAILED DESCRIPTION OF A PREFERRED EMBODIMENT

Figure 1:
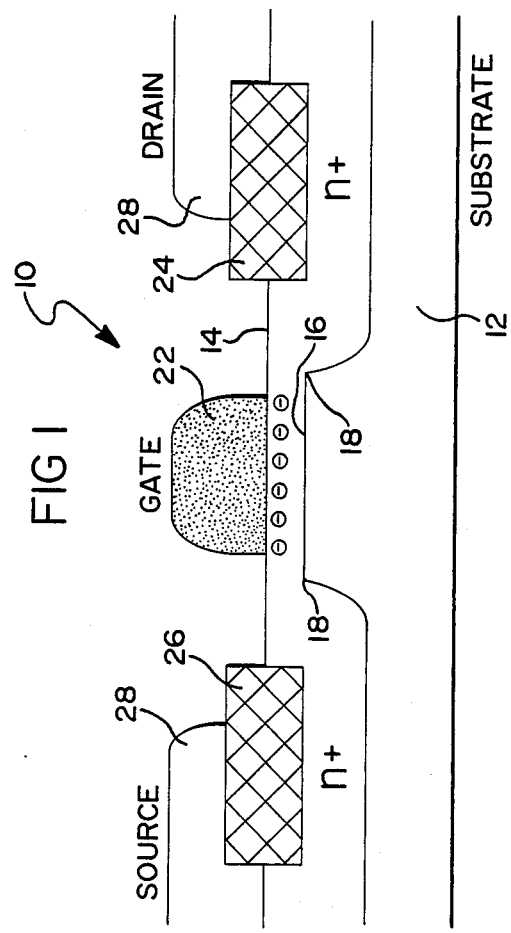
FIG. 1 is a side sectional view of a field effect transistor fabricated in accordance with the present invention.

Referring now to FIG. 1, a field effect transistor 10 fabricated by the present invention is illustrated. As shown, the transistor 10 is formed on a substrate 12 of semiconductor material made of a composition such as a semi-insulating gallium arsenide, silicon, indium phosphide or a film of any of these on top of another substrate, such as glass, single crystal silicon, mylar, or stainless steel. The substrate 12 has a surface 14 and includes a channel region 16 below the surface thereof containing a carrier concentration of a desired conductivity type, such as n, n+, n−, p or p+.

Deposited on the substrate 12 is a gate 22 having a gate length of a controlled dimension to reduce the breakdown voltage at the gate due to the increased separation 16 of the gate from the end of the channels 18. Gate 22 is operative to form a channel region 18 proximate the interface with the substrate 12, enabling the transistor 10 to achieve a relatively high transconductance. On top of the substrate 12 is a drain 24 and a source 26.

The insulator material utilized for the substitutional gate is preferably silicon dioxide or photoresist, or may also be made of a composition selected from the group consisting of aluminum nitride, aluminum oxide, tantalum oxide, titanium oxide, tungsten oxide, gallium oxide, arsenic oxide, molybdenum oxide, oxynitride, gallium arsenide oxide, aluminum gallium arsenide oxide, indium gallium arsenide phosphide oxide and indium phosphide oxide.

Gate 22 is generally made of a multi-layered structure consisting of refractory materials, such as platinum and gold. Gate 22 is deposited directly on top of substrate 12. Also deposited on the substrate 12 is a drain 24 of ohmic material, acting as the drain electrode. A source 26, also made of an ohmic material, is deposited over the substrate 12 on the opposite side of gate 22 from drain 24. Drain 24 and source 26 may be formed of any suitable ohmic material, such as aluminum, molybdenum or molybdenum tantalum alloy, chrome, titanium, tungsten, palladium and platinum. Preferably, the ohmic material is gold-germanium. The drain 24 and source 26 include an ion implanted region having a carrier conductivity of a desired conductivity type, preferably n+. Both the drain 24 and the source 26 are self-aligned to the gate 22. Metallic interconnects 28 are deposited on top of both said drain 24 and source 26 to act as an electrical connection for current conduction paths in the transistor.

Referring now to FIG. 2, representative steps for the process of the present invention are illustrated. A region below the surface of a substrate is ion implanted to form a channel containing a carrier concentration of a desired conductivity type and is thereafter annealed at a high temperature, from about 800° to 850° Celsius to activate the ion implanted region. A layer of insulator is deposited onto the substrate and selectively etched away to reduce the layer to a substitutional gate. The deposition of the substitutional gate insulator material may be accomplished by any standard deposition technique.

After the substitutional gate has been formed, sidewalls are formed on the substitutional gate by depositing a conformal layer of sidewall material, such as a dielectric material which may be selected from the group consisting of silicon dioxide, silicon nitride, polymers and photoresist over the entire substrate and the substitutional gate. Dry etching is then performed to form the sidewalls. Preferentially, reactive ion etching is used because the sidewall material selectively etches away much faster than the substitutional gate material, i.e. something on the order of 20-1 etching rates. The reactive ion etching process reduces the thickness of the sidewalls to a thickness of about 0.05 to 0.3 microns, preferably 1500 to 2000 angstroms. The sidewall thickness will determine the distance between the gate and the ends of the channels will be.

After the sidewall formation, ion implanting is accomplished by ion implanting an n+ type implantation species while the substitutional gate and the sidewalls provide a mask to prevent ion implantation immediately below and adjacent to the substitutional gate. The ion implantation process induces a straggling n+ area to slightly encroach into the area under the sidewall construction, providing a channel length which is longer than the substitutional gate length.

Removing of the sidewalls after ion implantation is accomplished by dry etching, preferably reactive ion etching or plasma etching, leaving the substitutional gate.

Instead of coating the entire structure with a cap to prevent evaporation from within the substrate, capless annealing is accomplished by placing the structure in an arsine environment overpressure at a high temperature.

This annealing is performed from about 750° to 1200° Celsius at an overpressure of arsine from about 0.010 to about 0.10 atmospheric pressure. The annealing may be performed in a composite gas environment containing at least arsine for about 10 seconds to 60 minutes. Preferably, the annealing is performed for about twenty minutes. After annealing, a planarizing material selected from the group consisting of polymers and photoresist is applied as a conformal layer over the substrate surface and the substitutional gate. The planarizing material is etched back to expose the substitutional gate. Once the substitutional gate is exposed, buffered hydrofluoric acid is applied to the structure to remove the substitutional gate. This forms a planarizing material structure having a desired angle between the top of the structure, the bottom of the structure and the surface of the structure. The undercutting is performed to form an angle of from about 75° to 90°, but preferably is between 80° and 85°. This undercutting will facilitate gate metal lift-off and also define the shape of the gate material deposited thereafter because the gate metal is deposited into the space left by the substitutional gate and conforms to the undercut planarizing material. Depositing of the gate material is accomplished by the deposition of a multi-layer structure including refractory materials, such as platinum and gold, in a conformal fashion atop the entire surface of the substrate.

The planarizing material is then stripped away, taking with it the gate material deposited thereon, leaving the gate metal deposited on top of the substrate. Ohmic contacts are then deposited over the region which was left unmasked by the substitutional gate. Metallic interconnects are deposited over the ohmic contacts to provide conduction paths for electricity through the transistor. Further conventional techniques are used to complete the transistor for incorporation into semiconductor devices.

It should be understood that while the best modes for carrying out the invention have been described in detail, those familiar with the art to which this invention relates will recognize various alternative ways and embodiments for practicing the invention as defined by the following claims.

What is claimed is:

1. A process for producing a semiconductor device, comprising:
   a. depositing a layer of insulator material onto a supporting substrate of the type having a surface and which includes a channel region below the surface containing a carrier concentration of a desired conductivity type;
   b. removing selected portions of the insulator material to form a substitutional gate on the substrate surface;
   c. forming sidewalls of a dielectric material selected from the group consisting of silicon dioxide, silicon nitride, polymers and photoresist bounding the substitutional gate to define an effective masking area in cooperation with the substitutional gate;
   d. reducing the thickness of the sidewalls to a desired thickness;
   e. ion implanting a dopant into the unmasked region of the substrate;
   f. removing the sidewalls;
   g. annealing the resultant device;
   h. applying a planarizing polymeric material over the substrate surface and the substitutional gate and thereafter etching back to expose the top of the substitutional gate;
   i. removing the substitutional gate;
   j. depositing gate metal and first and second ohmic contacts in correct positional relation to one another on the substrate; and
   k. depositing metallic interconnects in electrical communication with the ohmic contacts to produce a semiconductor device.

2. A process as in claim 1, wherein said supporting substrate includes a III-V compound substrate.

3. A process as in claim 1, wherein said supporting substrate includes a semi-insulating gallium arsenide material substrate.

4. A process as in claim 1, wherein said supporting substrate includes an indium phosphide substrate.

5. A process as in claim 1, wherein said supporting substrate includes a silicon substrate.

6. A process as in claim 1, wherein said insulator material is made from a composition selected from the group consisting of silicon dioxide, silicon nitride, aluminum nitride, aluminum oxide, tantalum oxide, titanium oxide, tungsten oxide, gallium oxide, arsenic oxide, molybdenum oxide, oxynitride, gallium arsenide oxide, aluminum gallium arsenide oxide, indium gallium arsenide phosphide oxide and indium phosphide oxide.

7. A process as in claim 1, wherein said reducing the thickness of sidewalls is accomplished by performing a reactive ion etching process.

8. A process as in claim 7, wherein said reactive ion etching process reduces the thickness of the sidewall to a thickness of about 0.05 to 0.3 microns.

9. A process as in claim 1, wherein said ion implanting is accomplished by ion implanting an n-type implantation species while the substitutional gate provides a mask to prevent ion implantation directly under the substitutional gate area.

10. A process as in claim 1, wherein said removing of the sidewalls is accomplished by dry etching.

11. A process as in claim 1, wherein said removing of the sidewalls is accomplished by reactive ion etching, wherein the sidewall material is removed at a much faster rate than the substitutional gate material.

12. A process as in claim 1, wherein said annealing is capless annealing performed at a high temperature.

13. A process as in claim 12, wherein said annealing is performed from about 750° to 1200° Celsius.

14. A process as in claim 1, wherein said annealing is performed at an over-pressure of arsine from about 0.01 to about 0.10 atmospheric pressure.

15. A process as in claim 1, wherein said annealing is performed in a composite gas environment containing at least arsine.

16. A process as in claim 1, wherein said annealing is performed for about 10 seconds to 60 minutes.

17. A process as in claim 16, wherein said annealing is performed for about twenty minutes.

18. A process as in claim 1, wherein removing the substitutional gate is accomplished by using buffered hydrofluoric acid.

19. A process as in claim 1, further comprising forming a planarizing material structure having a desired angle between the top of the structure, the bottom of the structure and the surface of the substrate, whereby a substitutional gate profile is achieved.

20. A process as in claim 19, wherein said undercutting is performed to form an angle of from about 75° to 90°.

21. A process as in claim 1, wherein said depositing of gate metal is accomplished by the deposition of a multi-layer structure including refractory materials in a conformal fashion atop the entire surface of the substrate.

22. A process for producing a semiconductor device comprising:
 a. depositing a layer of silicon dioxide to a thickness of about 4000 to 15,000 angstroms onto a supporting gallium arsenide substrate having a surface and including a channel region below the surface which contains a carrier concentration of an n-type conductivity;
 b. removing portions of the silicon dioxide to form a substitutional gate on the surface;
 c. forming sidewalls of a dielectric material selected from the group consisting of silicon dioxide, silicon nitride, polymers and photoresists bounding the substitutional gate by depositing a layer of silicon nitride to a thickness of about 2000 angstroms and removing selected portions by etching to form sidewalls sufficiently thick to perform ion implantation blockage;
 d. reducing the thickness of the sidewalls to a desired thickness;
 e. ion implanting an n+ type dopant into the unmasked region of the substrate;
 f. removing the sidewalls from the substitutional gate by preferentially etching the sidewalls without etching the substitutional gate;
 g. capless annealing for about two minutes under arsine overpressure at about 800° to 900° Celsius to prevent arsenic evaporation;
 h. applying a planarizing polymeric material over the substrate surface and the substitutional gate and thereafter etching back to expose the top of the substitutional gate;
 i. removing the substitutional gate by applying buffered hydrofluoric acid to the substitutional gate;
 j. depositing gate metal and first and second ohmic contacts in correct positional relation to one another on the substrate; and
 k. depositing metallic interconnects in electrical communication with the ohmic contacts to produce a semiconductor device.

* * * * *

UNITED STATES PATENT AND TRADEMARK OFFICE
CERTIFICATE OF CORRECTION

PATENT NO. : 4,745,082
DATED : May 17, 1988
INVENTOR(S) : Siang P. Kwok

It is certified that error appears in the above-identified patent and that said Letters Patent is hereby corrected as shown below:

IN THE SPECIFICATION

In column 2, line 5, please delete the word "influence" and insert in its place the word ---influences---.

In column 2, lines 9-10, please delete the phrase ""Method of Making Self-Aligned discloses an IGFET". The IGFET" and insert in its place the phrase ---"Method of Making Self-Aligned IGFET", discloses an IGFET---.

Signed and Sealed this

Thirteenth Day of December, 1988

Attest:

DONALD J. QUIGG

*Attesting Officer*       *Commissioner of Patents and Trademarks*